(12) United States Patent
Yedidia et al.

(10) Patent No.: US 8,261,170 B2
(45) Date of Patent: Sep. 4, 2012

(54) MULTI-STAGE DECODER FOR ERROR-CORRECTING CODES

(75) Inventors: Jonathan S. Yedidia, Cambridge, MA (US); Yige Wang, Natick, MA (US); Stark C. Draper, Madison, WI (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 838 days.

(21) Appl. No.: 12/360,832

(22) Filed: Jan. 27, 2009

(65) Prior Publication Data

US 2010/0192040 A1 Jul. 29, 2010

Related U.S. Application Data

(63) Continuation-in-part of application No. 11/764,938, filed on Jun. 19, 2007, now Pat. No. 7,945,845.

(51) Int. Cl.
*H03M 13/03* (2006.01)
(52) U.S. Cl. ...................................... 714/794
(58) Field of Classification Search .................. 714/752, 714/794
See application file for complete search history.

(56) References Cited

U.S. PATENT DOCUMENTS

| | | | |
|---|---|---|---|
| 7,373,585 B2 | 5/2008 | Yedidia et al. | |
| 7,856,584 B2 * | 12/2010 | Ovchinnikov et al. | 714/752 |
| 2007/0113163 A1 * | 5/2007 | Golitschek Edler Von Elbwart et al. | 714/801 |
| 2007/0283227 A1 * | 12/2007 | Sharon et al. | 714/776 |
| 2008/0010581 A1 * | 1/2008 | Alrod et al. | 714/763 |
| 2009/0158114 A1 * | 6/2009 | Shokrollahi | 714/752 |
| 2009/0319861 A1 * | 12/2009 | Sharon et al. | 714/752 |
| 2010/0287436 A1 * | 11/2010 | Lastras-Montano et al. | 714/752 |
| 2011/0258510 A1 * | 10/2011 | Watson et al. | 714/752 |

OTHER PUBLICATIONS

G.D. Forney, "Codes on Graphs: Normal Realizations," IEEE Transactions on Information Theory, Feb. 2001, vol. 47, pp. 520-548.
C. Berrou, "The Ten-Year-Old Turbo Codes are entering into Service," IEEE Communications Magazine, vol. 41, pp. 110-117, Aug. 2003.
T. Richardson and R. Urbanke, "The Renaissance of Gallager's Low-Density Parity Check Codes," IEEE Communications Magazine, vol. 41, pp. 126-131, Aug. 2003.
Y. Kou, "Low Density Parity Check Codes Based on Finite Geometries: A Rediscovery and More," IEEE Transactions on Information Theory, vol. 47, pp. 2711-2736, Nov. 2001.
F.R. Kschischang, "Factor Graphs and the Sum-Product Algorithm," IEEE Transactions on Information Theory, vol. 47, pp. 498-519, Feb. 2001.
Richardson et al., "The capacity of low-density parity-check codes under message-passing decoding," IEEE Trans. Inform. Theory, vol. 47, pp. 599-618, Feb. 2001.
C. Berrou, "Near-Optimum Error-Correcting Coding and Decoding: Turbo-codes," IEEE Transactions in Communications, vol. 44, pp. 1261-1271, Oct. 1996.

(Continued)

*Primary Examiner* — Scott Baderman
*Assistant Examiner* — Neil Miles
(74) *Attorney, Agent, or Firm* — Dirk Brinkman; Gene Vinokur (57) ABSTRACT

A multi-stage decoder decodes a block of symbols, received via a noisy channel, to a codeword. The decoder includes multiple sub-decoders connected sequentially, and wherein a next sub-decoder has a slower processing time and better word error rate than a previous sub-decoder, and wherein the next sub-decoder is only executed if the previous decoder fails to decode the block sequence of symbols, and a last sub-decoder is executed until a termination condition is reached.

13 Claims, 4 Drawing Sheets

OTHER PUBLICATIONS

M.A. Shokrollahi, "Improved Low-Density Parity Check Codes Using Irregular Graphs," IEEE Trans. Information Theory, vol. 47, pp. 585-598 Feb. 2001.

D. Divsalar, "Coding Theorems for 'Turbo-like' Codes," Proc. $36^{th}$ Allerton Conference on Communication, Control, and Computing, pp. 201-210, Sep. 1998.

M. Luby, "LT Codes," Proc. Of the 43 Annual IEEE Symposium on Foundations of Computer Science, pp. 271-282, Nov. 2002.

A. Shokrollahl "Raptor Codes," Proceedings of the IEEE International Symposium on Information Theory, p. 36, Jul. 2004.

Taghavi et al., "Adaptive methods for linear programming decoding," IEEE Transactions on Information Theory, vol. 54, No. 12, pp. 5386-5410, Dec. 2008.

Michael Mitzenmacher, "A Note on Low Density Parity Check Codes for Erasures and Errors," SRC Technical Note 1998-017, Dec. 11, 1998; Compaq Systems Research Center.

\* cited by examiner

MULTI-STAGE DECODER FOR ERROR-CORRECTING CODES

RELATED APPLICATION

This U.S. patent application is a Continuation-in-Part of U.S. patent application Ser. No. 11/764,938, "Maximum Likelihood Decoding via Mixed-Integer Adaptive Linear Programming," filed by Draper et al., on Jun. 19, 2007, now U.S. Pat. No. 7,945,845, incorporated herein by reference. This application is also related to Ser. No. 12/360,839 co-filed herewith.

FIELD OF THE INVENTION

This invention relates generally to decoding codewords of an error-correcting code, and more particularly to decoding codewords using a multi-stage decoder.

BACKGROUND OF THE INVENTION

Error-Correcting Codes

A fundamental problem in the field of data storage and communication is the development of practical decoding methods for error-correcting codes (ECC).

One very important class of error-correcting codes is the class of linear block error-correcting codes. Unless specified otherwise, any reference to a "code" herein refers to a linear block error-correcting code.

The basic idea behind these codes is to encode a block of k information symbols using a block of N symbols, where N>k. The additional N−k bits are used to correct corrupted signals when they are received over a noisy channel or retrieved from faulty storage media.

A block of N symbols that satisfies all the constraints of the code is called a "code-word," and the corresponding block of k information symbols is called an "information block." The symbols are assumed to be drawn from a q-ary alphabet.

An important special case is when q=2. In this case, the code is called a "binary" code. In the examples given herein, binary codes are assumed, although the generalization of the decoding methods described herein to q-ary codes with q>2 is usually possible. Binary codes are the most important codes used in practice.

In a conventional "channel coding" with a linear block error-correcting code, a source produces an information block of k symbols u[a]. The information block is passed to an encoder of the error-correcting code. The encoder produces a code-word x[n] containing N symbols. The code-word is then transmitted through a channel, where the code-word is possibly corrupted into a signal y[n]. The corrupted signal y[n] is then passed to a decoder, which attempts to output a reconstruction z[n] of the code-word x[n].

Code Parameters

A binary linear block code is defined by a set of $2^k$ possible code-words having a block length N. The parameter k is sometimes called the "dimension" of the code. Codes are normally much more effective when N and k are large. However, as the size of the parameters N and k increases, so does the difficulty of decoding corrupted messages.

The Hamming distance between two code-words is defined as the number of symbols that differ in two words. The distance d of a code is defined as the minimum Hamming distance between all pairs of code-words in the code. Codes with a larger value of d have a better error-correcting capability.

Codes with parameters N and k are referred to as [N,k] codes. If the distance d is also known, then the codes are referred to as [N, k, d] codes.

Code Parity Check Matrix Representations

A linear code can be represented by a parity check matrix. The parity check matrix representing a binary [N,k] code is a matrix of zeros and ones, with M rows and N columns. The N columns of the parity check matrix correspond to the N symbols of the code. The number of linearly independent rows in the matrix is N−k.

Each row of the parity check matrix represents a parity check constraint. The symbols involved in the constraint represented by a particular row correspond to the columns that have a non-zero symbol in that row. The parity check constraint forces the weighted sum modulo-2 of those symbols to be equal to zero. For example, for a binary code, the parity check matrix $$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix}$$

represents the three constraints $$x[1]+x[2]+x[3]+x[5]=0,$$

$$x[2]+x[3]+x[4]+x[6]=0, \text{ and}$$

$$x[3]+x[4]+x[5]+x[7]=0,$$

where x[n] is the value of the $n^{th}$ bit, and the addition of binary symbols is done using the rules of modulo-2 arithmetic, such that 0+0=1+1, and 0+1=1+0+1.

Graphical Model for a Code

The parity check matrix of a linear code is often represented using a graphical model, also called a "Tanner graph" in the art. A Tanner graph is a bi-partite graph with two kinds of nodes: "variable nodes" corresponding to codeword symbols, and "constraint nodes" corresponding to parity constraints. Thus, there is one variable node for each column of the parity check matrix representing the code, and one constraint node for each row of the parity check matrix. A variable node is connected to a constraint node in the Tanner graph if the corresponding symbol is in a constraint equation. Thus, there is a line connecting a variable node and a constraint node for each non-zero entry in the parity check matrix.

Other graphical models for codes exist, which can be easily converted into Tanner graphs. For example, G. David Formey, has popularized "factor graph" representation in which variables are represented by the lines in the graph, and code symbols are represented as an equality constraint between the variables, see G. D. Formey, "Codes on Graphs: Normal Realizations," IEEE Transactions on Information Theory, February 2001, vol. 47, pp. 520-548. Herein, we described decoding methods in terms of Tanner graphs, but it is well-understood how to convert these decoding methods to work with other graphical models.

Error-Correcting Code Decoders

The task of a decoder for an error-correcting code is to accept the received signal after the transmitted code-word has been corrupted in a channel, and try to reconstruct the transmitted code-word. The optimal decoder, in terms of minimizing the number of code-word decoding failures, outputs the most likely code-word given the received signal. The optimal decoder is known as a "maximum likelihood" decoder. Even a maximum likelihood (ML) decoder will sometimes make a decoding error and output a code-word that is not the transmitted code-word if the noise in the channel is sufficiently great.

Iterative Decoders

In practice, maximum likelihood decoders can only be constructed for special classes of error-correcting codes. There has been a great deal of interest in non-optimal, approximate decoders based on iterative methods. One of these iterative decoding methods is called "belief propagation" (BP). Although he did not call it by that name, R. Gallager first described a BP decoding method for low-density parity check (LDPC) codes in 1963.

Turbo Codes

In 1993, similar iterative methods were shown to perform very well for a new class of codes known as "turbo-codes." The success of turbo-codes was partially responsible for greatly renewed interest in LDPC codes and iterative decoding methods. There has been a considerable amount of recent work to improve the performance of iterative decoding methods for both turbo-codes and LDPC codes, and other related codes such as "turbo product codes" and "repeat-accumulate codes." For example a special issue of the IEEE Communications Magazine was devoted to this work in August 2003. For an overview, see C. Berrou, "The Ten-Year-Old Turbo Codes are entering into Service," IEEE Communications Magazine, vol. 41, pp. 110-117, August 2003 and T. Richardson and R. Urbanke, "The Renaissance of Gallager's Low-Density Parity Check Codes," IEEE Communications Magazine, vol. 41, pp. 126-131, August 2003.

Many turbo-codes and LDPC codes are constructed using random constructions. For example, Gallager's original binary LDPC codes are defined in terms of a parity check matrix, which consists only of 0's and 1's, where a small number of 1's are placed randomly within the matrix according to a pre-defined probability distribution. However, iterative decoders have also been successfully applied to codes that are defined by regular constructions, like codes defined by finite geometries, see Y. Kou, S. Lin, and M. Fossorier, "Low Density Parity Check Codes Based on Finite Geometries: A Rediscovery and More," IEEE Transactions on Information Theory, vol. 47, pp. 2711-2736, November, 2001. In general, iterative decoders work well for codes with a parity check matrix that has a relatively small number of non-zero entries, whether that parity check matrix has a random or regular construction.

In a system with a decoder of an LDPC code based on BP, the system processes the received symbols iteratively to improve the reliability of each symbol based on the constraints, as given by the parity check matrix that specifies the code.

In a first iteration, the BP decoder only uses channel evidence as input, and generates soft output messages from each symbol to the parity check constraints involving that symbol. The step of sending messages from the symbols to the constraints is sometimes called the "vertical" step. Then, the messages from the symbols are processed at the neighboring constraints to feed back new messages to the symbols. This step is sometimes called the "horizontal" step. The decoding iteration process continues to alternate between vertical and horizontal steps until a certain termination condition is satisfied. At that point, hard decisions are made for each symbol based on the output reliability measures for symbols from the last decoding iteration.

The messages of the BP decoder can be visualized using the Tanner graph, described above. Vertical step messages go from variable nodes to constraint nodes, while horizontal step messages go from constraint nodes to variable nodes.

The precise form of the message update rules, and the meaning of the messages, varies according to the particular variant of the BP method that is used. Two particularly popular message-update rules are the "sum-product" rules and the "min-sum" rules. These prior-art message update rules are very well known, and approximations to these message update rules also have proven to work well in practice. Further details are described in U.S. Pat. No. 7,373,585, "Combined-replica group-shuffled iterative decoding for error-correcting codes," issued to Yedidia, et al. on May 13, 2008, incorporated herein by reference.

In some variants of the BP method, the messages represent the log-likelihood that a bit is either a 0 or a 1. For more background material on the BP method and its application to error-correcting codes, see F. R. Kschischang, B. J. Frey, and H.-A. Loeliger, "Factor Graphs and the Sum-Product Algorithm," IEEE Transactions on Information Theory, vol 47, pp. 498-519, February 2001.

Quantized Belief Propagation

In practice, a popular way to implement BP decoders is to quantize the messages to some small number of possible values. For example, a decoder may only use messages that have the values +1 and −1. Quantized BP (QBP) decoders tend to become more powerful as the number of possible messages increases, thereby better approximating un-quantized BP decoders. On the other hand, as the number of possible messages increases, the cost and complexity of implementing the quantized BP decoder tends to increase as well.

Another QBP decoder is known in the art as "Algorithm-E," see Richardson et al., "The capacity of low-density parity-check codes under message-passing decoding," IEEE Trans. Inform. Theory, vol. 47, pp. 599-618, February 2001. Because this decoder is of particular interest, its functionality for decoding an LDPC code on the binary symmetric channel (BSC) is described in detail here.

The Algorithm-E decoder decodes an input sequence of symbols received from a BSC. The input sequence of symbols is represented by the vector y. Binary phase shift keying (BSPK) is used so that a 0 symbol at position n maps to $y_n=1$, and a 1 symbol at position n maps to $y_n=-1$.

Let $H=[H_{mn}]$ be a M by N parity check matrix of the LDPC code. The set of variable nodes that participate in check j is denoted by $N(j)=\{k:H_{jk}=1\}$, and the set of checks in which the variable k participates is denoted as $Q(k)=\{j:H_{jk}=1\}$. $N(j)\backslash k$ is the set $N(j)$ with variable k excluded, and $Q(k)\backslash j$ is the set $Q(k)$ with check j excluded.

The Algorithm-E decoder quantizes BP messages to −1, 0, or +1 values. Messages and beliefs associated with the ith iteration are denoted as:
- $u^{(i)}_{mn}$: The message passed from the check node m to variable node n;
- $v^{(i)}_{mn}$: The message passed from the variable node n to check node m; and
- $v^{(i)}_{n}$: The belief of variable node n.

The steps of the "Algorithm-E" decoder are:

Step 1: For $1 \leq m \leq M$, and each $n \in N(m)$, process $$u^{(i-1)}_{mn} = \prod_{n' \in N(m)\backslash n} v^{(i-1)}_{mn'}$$

Step 2: For $1 \leq n \leq N$, and each $m \in Q(n)$, process $$v_{mn}^{(i)} = \text{sgn}\left(w^{(i)} \cdot y_n + \sum_{m' \in Q(n) \backslash m} u_{m'n}^{(i)}\right),$$

where w(i) is an appropriately selected weight, and $$v_n^{(i)} = \text{sgn}\left(w^{(i)} \cdot y_n + \sum_{m' \in Q(n)} u_{m'n}^{(i)}\right).$$

Here sgn(x)=1 if x>0, sgn(x)=−1 if x<0, and sgn(0)=0.
Step 3: construct a vector $\hat{c}^{(i)} = [\hat{c}^{(i)}]$, such that $\hat{c}^{(i)} = 1$ if $v^{(i)}_n < 0$, $\hat{c}^{(i)} = 0$ if $v^{(i)}_n > 0$, randomly select $\hat{c}^{(i)}$ if $v^{(i)}_n = 0$. If $H\hat{c}^{(i)} = 0$, or $I_{max}$ is reached, stop the decoding iteration and output $\hat{c}^{(i)}$ as the decoded codeword. Otherwise, set i:=i+1 and go to Step 1.

Bit-Flipping Decoders

Bit-flipping (BF) decoders are iterative decoders that work similarly to BP decoders. These decoders are somewhat simpler. Bit-flipping decoders for LDPC codes also have a long history, and were also suggested by Gallager in the early 1960's when he introduced LDPC codes. In a bit-flipping decoder, each code-word bit is initially assigned to be a 0 or a 1 based on the channel output. Then, at each iteration, the syndrome for each parity check is computed. The syndrome for a parity check is 0 if the parity check is satisfied, and 1 if it is unsatisfied. Then, for each bit, the syndromes of all the parity checks that contain that bit are checked. If a number of those parity checks greater than a pre-defined threshold are unsatisfied, then the corresponding bit is flipped. The iterations continue until all the parity checks are satisfied or a predetermined maximum number of iterations is reached.

Other Codes that can be Decoded Iteratively

There are many other codes that can successfully be decoded using iterative decoding methods. Those codes are well-known in the literature and there are too many of them to describe them all in detail. Some of the most notable of those codes are turbo-codes, see C. Berrou and A. Glavieux, "Near-Optimum Error-Correcting Coding and Decoding: Turbo-codes," IEEE Transactions in Communications, vol. 44, pp. 1261-1271, October 1996; the irregular LDPC codes, see M. A. Shokrollahi, D. A. Spielman, M. G. Luby, and M. Mitzenmacher, "Improved Low-Density Parity Check Codes Using Irregular Graphs," IEEE Trans. Information Theory, vol. 47, pp. 585-598 February 2001; the repeat-accumulate codes, see D. Divsalar, H. Jin, and R. J. McEliece, "Coding Theorems for 'Turbo-like' Codes," Proc. $36^{th}$ Allerton Conference on Communication, Control, and Computing, pp. 201-210, September, 1998; the LT codes, see M. Luby, "LT Codes," Proc. Of the 43 Annual IEEE Symposium on Foundations of Computer Science, pp. 271-282, November 2002; and the Raptor codes, see A. Shokrollahi, "Raptor Codes," Proceedings of the IEEE International Symposium on Information Theory, p. 36, July 2004.

Linear Programming and Adaptive Linear Programming Decoders

An alternate decoding method for LDPC codes is based on linear programming (LP). LP decoding has some attractive features not available in BP decoding. The LP decoder deterministically converges. Whenever the decoder outputs a codeword, the codeword is guaranteed to be a maximum likelihood (ML) solution. When the LP decoder converges to a non-binary solution, a well-defined "pseudo-codeword" has been found.

The ML decoding problem is equivalent to the following integer optimization problem:
minimize $\gamma^T \hat{c}$ subject to $\hat{c} \in C$,
where $\gamma$ is a known vector of negative log-likelihoods, and T is a transpose operator, wherein the nth entry is defined as $$\gamma_n = \log\left(\frac{Pr[y_n \mid c_n = 0]}{Pr[y_n \mid c_n = 1]}\right).$$

When the channel is BSC, $\gamma_n = \log [p/(1-p)]$, if a received BSPK symbol is $y_n = -1$, and $\gamma_n = \log [(1-p)/p]$ if the received BSPK symbol is $y_i = 1$.

The variables and constraints in above integer optimization problem are binary. In a relaxed LP version of the problem, each symbol $\hat{c}_n$ is relaxed to a corresponding variable $\hat{b}_n$, which can take values between 0 and 1. Each parity check is replaced by a number of local linear constraints that the codewords must satisfy. The intersection of these constraints defines the polytope over which the LP solver operates. The binary vertexes of the polytope correspond to codewords in the code C. When the LP optimum is at such a vertex, the LP is satisfied, and the ML solution is found. Non-binary solutions are termed pseudo-codewords.

Unfortunately, LP decoding is more complex than BP decoding. One approach reduces the computational load by using an adaptive linear programming (ALP) decoder, see Taghavi et al., "Adaptive methods for linear programming decoding," IEEE Transactions on Information Theory, vol. 54, no. 12, pp. 5386-5410, December 2008.

Mixed-Integer Linear Programming Decoders

When the solution to the LP decoding problem is non-binary, one is motivated to find a tightening of the original LP relaxation. The objective of the tightening is to produce a modified LP problem that eliminates the formerly optimum pseudo-codeword, without eliminating any binary vertexes, thereby driving the solution of the modified LP problem towards the ML solution.

One approach is to add a small number of integer constraints resulting in a mixed integer linear program (MILP). In particular, in a MILP decoder, one can identify the symbol whose value is closest to 0.5. For this index $n^* = \arg \min_n |\hat{b}_n - 0.5|$, the decoder includes the integer constraint $\hat{b}_{n^*} \in \{0, 1\}$, and re-executes the LP decoder including this integer constraint. If, even after adding an integer constraint, the MILP decoder fails to decode, more integer constraints can be added. In the related application by Draper et al., this approach is used for an LDPC code.

Performance of Different Decoders of the Same Code

For each different type of code, a number of different decoders will, in general, be available. For example, for an LDPC code, one can choose between (among others) bit-flipping decoders, quantized BP decoders at different levels of quantization, BP decoders using sum-product or min-sum methods, LP decoders, and MILP decoders.

For other well-known codes, like for example Reed-Solomon codes, there also exist a multiplicity of different decoding methods, including "classical" decoding methods found in coding textbooks like the Berlekamp-Massey decoding method, or newer decoding methods based on belief propagation, or list decoding methods.

Different decoding methods are generally compared by plotting the error rate of the decoder as a function of the signal-to-noise ratio (SNR). Two common measures are the "word error rate," (WER), which measures the fraction of blocks that are not correctly decoded to the transmitted codeword, and the "bit error rate" (BER), which measures the fraction of bits that are incorrectly decoded. Herein, the focus is on WER. A decoder is "better," or "more powerful" than another at a particular signal-to-noise ratio if its WER is lower.

Figure 3:
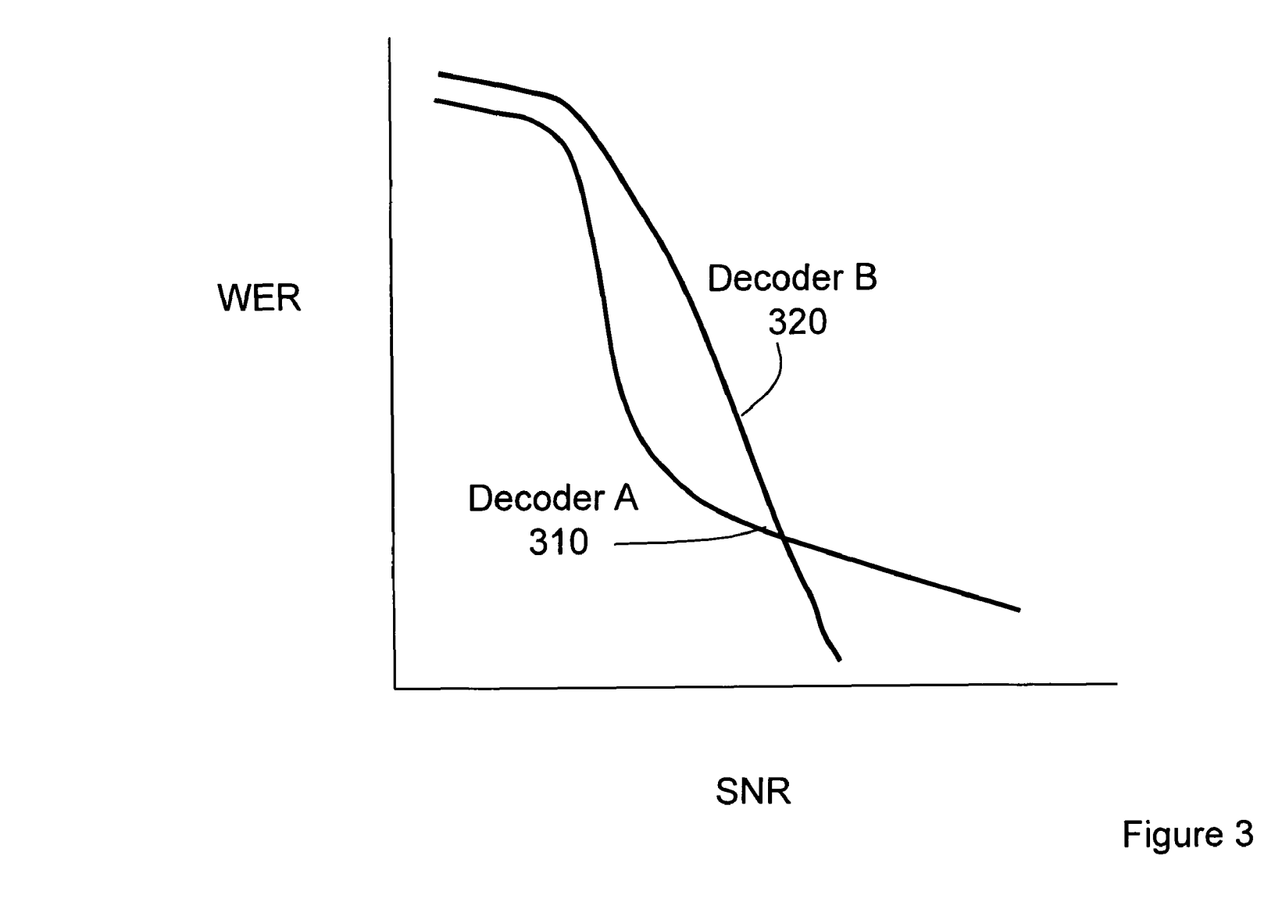
FIGS. 3-4 are graphs comparing word error rate performance as a function of signal-to-noise ratio for example decoders.
Figure 4:
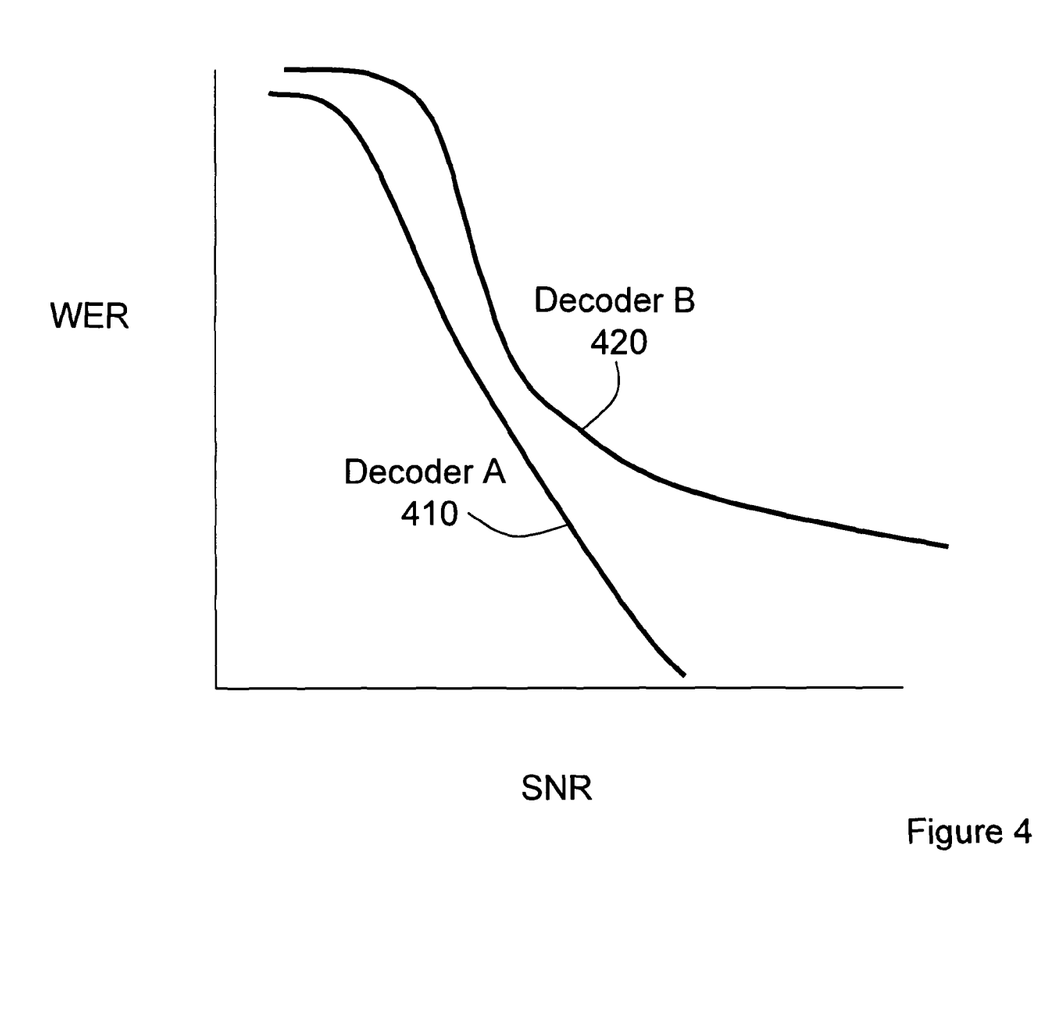

FIG. 3 shows the WER as a function of SNR for different decoders operating on the same code. In this example, decoder A 310 is better than decoder B for low signal-to-noise ratios, but decoder B 320 is better than decoder A for high signal-to-noise ratios. FIG. 4 shows an example where decoder A 410 performs better than decoder B 420 at every SNR.

Processing Time of Decoders

Often, there is a trade-off between the WER performance of a decoder and the time it takes the decoder to process a block. As an example, if a BP decoder is allowed to run for more iterations per block before being terminated, it will have a better WER performance. Simple decoders tend to have a small processing time but poor WER performance while more complex decoders tend to have a longer processing time and better WER performance. Sometimes one decoder will have a WER that is orders of magnitude better than a second decoder, but also have a processing time that is orders of magnitude worse than the second decoder.

It is highly desirable to construct decoders that eliminate the tradeoff between performance and processing time, i.e., decoders that have simultaneously an excellent performance and a small processing time.

SUMMARY OF THE INVENTION

The idea of the invention is to combine, into a single multi-stage decoder, multiple sub-decoders that can be ordered in terms of their word error rate (WER) performance at the operating regime of interest. The first sub-decoder is the worst performing decoder, and the last sub-decoder is the best performing decoder. The sub-decoders are also be orderable in terms of their processing time. The first sub-decoder has the shortest processing time per block, while the last sub-decoder has the longest processing time per block.

The embodiments of the invention provide a multi-stage decoder that sequentially combines a quantized belief propagation (QBP) sub-decoder, an un-quantized belief propagation (UBP) sub-decoder, and a mixed-integer linear programming (MILP) sub-decoder or a linear programming decoder. Each sub-decoder is activated only when the preceding sub-decoder fails to converge to a valid codeword.

The faster QBP and UBP sub-decoders are able to correct most errors, yielding a short average decoding time. Only in the rare cases, when both the QBP and UBP sub-decoders fail, is the slower but better performing linear programming decoder or MILP sub-decoder used.

Results show a large improvement in the WER of the multi-stage decoder, in comparison to conventional BP decoding. The improvement is particularly noticeable in a high SNR regime. The multi-stage decoder can also significantly speed up the decoding of LDPC codes. For certain codes, the invention can efficiently approach the optimal ML decoding performance in the high SNR regime, at a much lower complexity than using only the linear programming decoder or MILP decoder.

The invention also improves upon QBP decoders by only updating check and variable node when messages change. At high SNRs, only a small fraction of messages from variable and check nodes need to be updated. Thus, decoding requires only a small fraction of the computation compared to the conventional QBP decoder.

DETAILED DESCRIPTION OF THE PREFERRED EMBODIMENT

Figure 1:
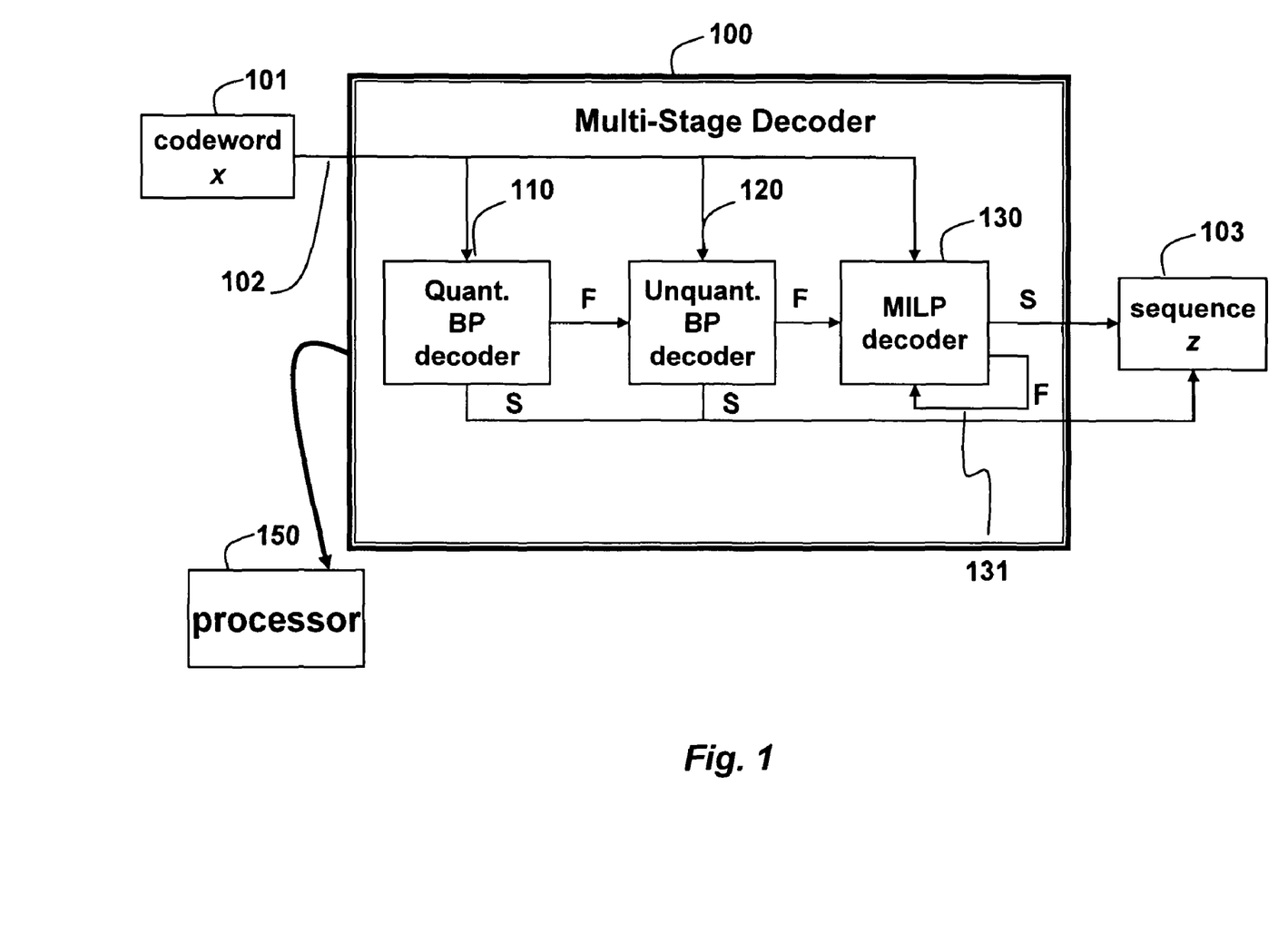
FIG. 1 is a block diagram of multi-stage decoder according to embodiments of the invention.

FIG. 1 shows a multi-stage decoder 100 for low-density parity-check (LDPC) codes according to embodiments of our invention. The decoder includes a quantized belief propagation (QBP) sub-decoder 110, an unquantized BP (UBP) sub-decoder 120, and a linear programming (LP) decoder or mixed-integer linear programming (MILP) sub-decoder 130, connected sequentially.

The multi-stage decoder 100 receives a codeword x 101 transmitted via a noisy channel 102. The sub-decoder 110 attempts to decode the codeword 101. If the sub-decoder 110 fails, then the sub-decoder 120 attempts to decode. If the sub-decoder 120 fails, then the sub-decoder 130 attempts to decode, until a termination condition in reached. The sub-decoders are arranged so that a next sub-decoder in the sequence has a slower processing time (T) and better word error rate (WER), than a previous sub-decoder, i.e., $T_{QBP} \ll T_{UBP} \ll T_{MILP}$, and $WER_{QBP} \gg WER_{UBP} \gg WER_{MILP}$.

A "decoding failure" indicates that the specified decoder fails to output a valid codeword. For example, the QBP decoder may fail to converge. If the decoder outputs a valid, but incorrect codeword, this is a decoder "success", and does not trigger the execution of the following decoder. Of course, decoding "successes" that do not agree with the transmitted codeword contribute to the WER.

The MILP sub-decoder 130 works as follows. The sub-decoder 130 first attempts to perform standard LP decoding. If that fails, an integer constraint is added for the least reliable decoded bit. If decoding again fails, another integer constraint is added, and so on until decoding succeeds or some maximum number of integer constraints is reached. The MILP sub-decoder performs better with a larger maximum number of integer constraints, but also has a higher worst-case processing time.

Surprisingly, our multi-stage decoder, when arranged as described and shown herein, is approximately as fast as the fastest stage and with a WER approximately as good as the slowest stage. The following analysis is used to approximate the average processing time per block of the multi-stage decoder arranged as described herein. If we assume that a given sub-decoder stage takes a processing time of T per block, and has a word error rate of WER, then the multi-stage decoder has an average processing time per block of approximately $$T_{QBP}\left(1 + WER_{QBP}\frac{T_{UBP}}{T_{QBP}} + WER_{QBP-UBP}\frac{T_{MILP}}{T_{QBP}}\right),$$

where $T_{QBP}$ is the average processing time per block of the QBP sub-decoder 110, $T_{UBP}$ is the average processing time per block of the UBP sub-decoder 120, $T_{MILP}$ is the average processing time per block of the MILP sub-decoder 130, $WER_{QBP}$ is the WER of the QBP sub-decoder 110, and $WER_{QBP-UBP}$ is the WER of a two-stage decoder consisting of the QBP sub-decoder followed by the UBP sub-decoder, with no MILP sub-decoder.

Thus, so long as $WER_{QBP} \ll T_{QBP}/T_{UBP}$, and $WER_{QBP-UBP} \ll T_{QBP}/T_{MILP}$, then the average processing time per block is approximately the same as that of the decoder 110. At the same time, simulations show that the WER performance of the multi-stage decoder is nearly always at least as good as its last sub-decoder 130. It should be noted, that the concept of our multi-stage decoder is open to additional sequentially arranged decoders. For example, the number of stages and selection of decoders can be optimally designed for a specific LDPC code.

"Active set" Iterative Decoders

In a conventional iterative decoder, such as a conventional BP decoder, all messages from check nodes and variable nodes are updated at each iteration. However, this should not be needed for nodes for which the incoming messages have not changed since the last iteration. For example, for the BSC, at high enough signal-to-noise ratio (SNR), most messages in a conventional BP decoder never need to be updated during decoding because the channel only inverts a small number of transmitted bits, and decoding complexity can be reduced significantly.

The fundamental idea of our "active set" iterative decoder is to track the set of messages that have changed, and only update messages out of those nodes that have incoming messages in that set.

The speedup obtained using an "active set" iterative decoder is particularly important if a single processor or small number of processors is responsible for updating each of the messages. One does not want the processor to waste time re-calculating messages that have not changed.

An active set iterative decoder can be constructed for many different codes, channels, and decoding methods.

We describe an active set decoder for the particular embodiment of an Algorithm-E decoder of an LDPC code on the binary symmetric channel. We assume that the input sequence of bits is represented by the vector y, and that binary phase shift keying (BSPK) is used so that a 0 symbol at position n maps to $y_n=1$, and a 1 symbol at position n maps to $y_n=-1$.

Let $H=[H_{mn}]$ be a M by N parity check matrix of the LDPC code. The set of variable nodes that participate in check j is denoted by $N(j)=\{k:H_{jk}=1\}$, and the set of checks in which the variable k participates is denoted as $Q(k)=\{j:H_{jk}=1\}$. $N(j)\backslash k$ is the set $N(j)$ with codeword symbol k excluded, and $Q(k)\backslash j$ is the set $Q(k)$ with check j excluded.

Recall that the Algorithm-E decoder quantizes BP messages to −1, 0, or +1 values. Messages and beliefs associated with the ith iteration are denoted
 $u^{(i)}_{mn}$: The message passed from the check node m to variable node n;
 $v^{(i)}_{mn}$: The message passed from the variable node n to check node m; and
 $v^{(i)}_{n}$: The belief of variable node n.

For the active set Algorithm E decoder (QBP) 110, we define $A_v$ and $A_c$ as the active sets of variable nodes and check nodes, respectively. The active sets contain only the nodes to be updated. This is in contrast with prior art iterative decoders were all nodes are active and updated during each iteration.

Figure 2:
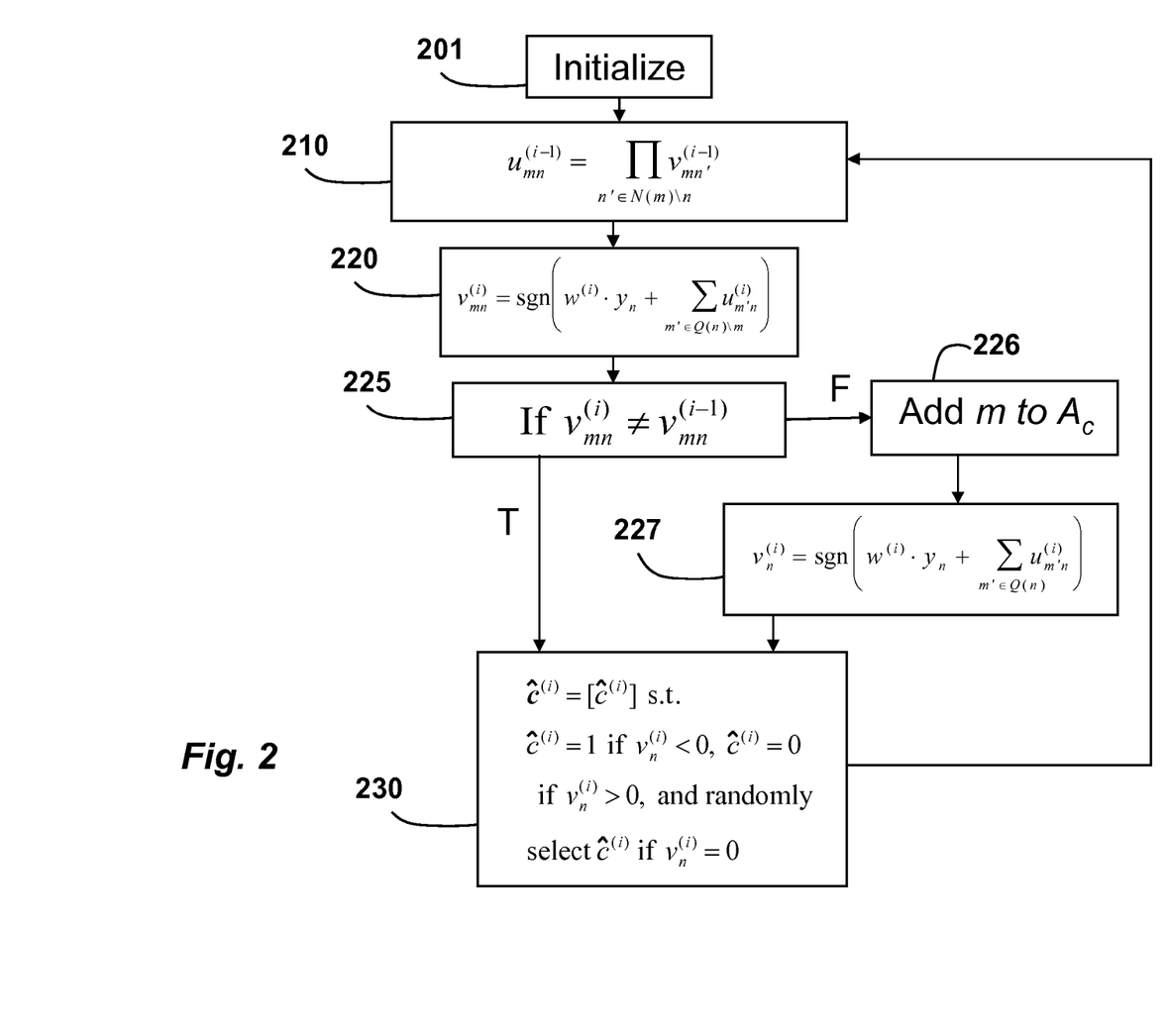
FIG. 2 is a flow diagram of a quantized belief propagation decoding according to embodiments of the invention.

The steps of the active set Algorithm E iterative decoder are as follows.

Initialization 201: Set i=1, $A_c=\emptyset$, i.e., empty, and the maximum number of iteration to $I_{max}$. For each check node m and variable node n, set $v^{(0)}_{mn}=1$, and $u^{(0)}_{mn}=1$. For each n, set $v^{(0)}_n=y_n$. If $y_n=-1$, set $v^{(0)}_{mn}=-1$, for all $m \in Q(n)$, and add these m into $A_c$.

Step 1 210: Set $A_v=\emptyset$, i.e., empty. For each $m \in A_c$, and $n \in N(m)$, process $$u^{(i-1)}_{mn} = \prod_{n' \in N(m)\backslash n} v^{(i-1)}_{mn'},$$

and add all these variable nodes n into the set $A_v$.

Step 2 220: Set $A_c=\emptyset$, i.e., empty. For each $n \in A_v$ and $m \in Q(n)$, process $$v^{(i)}_{mn} = \text{sgn}\left(w^{(i)} \cdot y_n + \sum_{m' \in Q(n)\backslash m} u^{(i)}_{m'n}\right),$$

where $w^{(i)}$ is an appropriately selected weight.

If $v^{(i)}_{mn} \neq v^{(i-1)}_{mn}$ 225, then add 226 this m into $A_c$, and 227 recomputes $$v^{(i)}_n = \text{sgn}\left(w^{(i)} \cdot y_n + \sum_{m' \in Q(n)} u^{(i)}_{m'n}\right).$$

where sgn(x)=1 for x>1, sgn(x)=−1 for x<1, and sgn(0)=0.

Step 3 230: Create the vector $\hat{c}^{(i)}=[\hat{c}^{(i)}]$ such that $\hat{c}^{(i)}=1$ if $v^{(i)}_n<0$, $\hat{c}^{(i)}=0$ if $v^{(i)}_n>0$, and randomly select $\hat{c}^{(i)}$ if $v^{(i)}n=0$. If $H\hat{c}^{(i)}=0$ or I is reached, stop the decoding iteration and output $\hat{c}^{(i)}$ as the decoded codeword. Otherwise, set i:=i+1, and go to Step 1.

This active set Algorithm E decoder has the same performance as a conventional Algorithm E decoder, but will have a smaller processing time per block if only a single or small number of processors is used to compute the messages.

Note that in software simulations of decoders of linear codes over binary input symmetric channels, one can make the simplifying assumption that the same codeword (normally the all-zeroes codeword is used for convenience) is transmitted at every block. This is because the decoder performance for every possible transmitted codeword is identical.

When we assume that an identical codeword is transmitted for every block, there is a further important possible speed-up of the initialization step of an active set decoder.

For example, for our active set Algorithm-E decoder for an LDPC on the BSC, if the same codeword is transmitted for each block, whenever a block is decoded successfully, the initialization step for the next block only takes O(Np) time to record the positions of the newly inverted bits, where p is the crossover probability of the channel. Otherwise, it would necessarily take O(N) time if we allowed arbitrary codewords to be transmitted, as all received symbols would need to be initialized to +1 or −1 with equal probability.

Table I shows the number of updates required by the conventional quantized decoder (E), our active set quantized decoder (Fast E) for a length-1908 rate-8/9 LDPC code.

TABLE I

|  | E | Fast E | E | Fast E |
|---|---|---|---|---|
| Crossover probability |  | 0.003 |  | 0.001 |
| WER |  | 0.15 |  | 0.00055 |
| Variable update | 17694 | 11924 | 2000 | 362 |
| Check update | 1966 | 1518 | 222 | 15 |

In Table I, "variable update" represents the average number of variable nodes processed in Step 2 for each block, and "check update" means the average number of check nodes processed in Step 1 for each block. These statistics are obtained by averaging over 100,000 transmitted blocks. Clearly, our decoder 110 outperforms the conventional quantized decoder in all aspects. Our decoder is particularly effective for relatively small crossover probabilities. This is especially useful for us to investigate the performance of a code at high SNRs.

We have described in detail an active set decoder for the binary symmetric channel (BSC). Constructing an active set decoder for other channels and other codes is also possible. In order to limit the number of messages that need to be updated for some of these possibilities, it may be preferable to set thresholds for the amount of change in the message that must occur for a message to be considered to be changed. Only if the message is sufficiently changed, i.e., the change is greater than the predetermined threshold, is the node that the message impinges upon be added to the active set. Another possibility for variable nodes is that one tracks the "belief" at the variable node, and only if the belief changes sufficiently will the variable node be added to the active set.

It is noted that the embodiments of the invention can be used with many different error-correcting codes, including low-density parity check codes; fountain codes, including Luby transform codes and raptor codes; turbo-codes; repeat-accumulate codes; and other related codes that can be decoded using iterative belief-propagation or bit-flipping decoders.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A multi-stage decoder for decoding a block of symbols, received via a noisy channel, to a codeword of an error-correcting code, comprising:
a plurality of sub-decoders connected sequentially, and wherein a next sub-decoder has a slower processing time and a better word error rate than a previous sub-decoder, and wherein the next sub-decoder is only executed if the previous decoder fails to decode the block sequence of symbols, and a last sub-decoder is executed until a termination condition is reached,
wherein any sub-decoders that use an iterative decoding method use an active set iterative decoding method, and
wherein the channel is a binary symmetric channel, and wherein the active set decoder further comprises:
an iterative belief propagation decoder, comprising: a set of check nodes; a set of variables nodes; and means for passing messages between the set of check nodes and the set of variable nodes, and wherein a set of outgoing messages from the check nodes is only updated if a set of incoming messages to the check node change, and the set of outgoing messages from a variables node is only updated if the incoming messages to the variable node change.

2. The multi-stage decoder of claim 1, wherein the plurality of sub-decoders comprises:
a quantized belief propagation (QBP) sub-decoder;
unquantized belief propagation (UBP) sub-decoder, and
a mixed-integer linear programming (MILP) sub-decoder connected sequentially.

3. The multi-stage decoder of claim 2, further wherein the executing of the last MILP sub-decoder further comprises:
adding iteratively binary constraints until either a maximum likelihood codeword is found, or some maximum number of binary constraints have been added to the MILP sub-decoder.

4. The multi-stage decoder of claim 1, wherein a number and selection of the sub-decoders is designed for a specific low-density parity-check (LDPC) code.

5. The multi-stage decoder of claim 1, wherein the set of outgoing messages is updated when the change in the set of incoming messages exceeds a threshold.

6. The multi-stage decoder of claim 1, wherein the nodes to be updated are added to an active set of nodes.

7. The multi-stage decoder of claim 1, wherein the channel is a binary symmetric channel, and wherein the active set decoder further comprises:
an iterative belief propagation decoder, comprising: a set of check nodes; and
a set of variables nodes, wherein each variable node has a belief, and
wherein a set of outgoing messages from the variables nodes are only updated if the beliefs change, and wherein a set of outgoing messages from a check node is only updated if the incoming messages to the check node change.

8. The multi-stage decoder of claim 7, wherein the outgoing messages from the variable node are only updated if the change in belief of the variable node exceeds a threshold and the set of outgoing messages from the check node are only updated if the change in the set of incoming messages to the check node exceeds the threshold.

9. The multi-stage decoder of claim 7, wherein the nodes to be updated are added to an active set of nodes.

10. The multi-stage decoder of claim 1, wherein the error correcting code is selected from a group consisting of low-density parity check codes, turbo-codes, turbo product codes, repeat-accumulate codes, Luby transform codes, and raptor codes.

11. The multi-stage decoder of claim 1, wherein the plurality of sub-decoders comprises: a quantized belief propagation (QBP) sub-decoder; unquantized belief propagation (UBP) sub-decoder, and a linear programming sub-decoder connected sequentially.

12. A method for decoding a block of symbols, received via a noisy channel, to a codeword of an error-correcting code, comprising a processor for performing steps of the method, comprising the steps:
decoding the block of symbols with a quantized belief propagation (QBP) decoder, and if the decoding by the QBP decoder fails;
decoding the block of symbols with an quantized belief propagation (UBP) decoder having a slower processing time and better word error rate than the QBP decoder, and if the decoding by the UBP decoder fails; and decoding file block of symbols with a linear programming decoder having a slower processing time and better word error rate than the UBP decoder.

13. A multi-stage decoder for decoding a block of symbols, received via a noisy channel, to a codeword of an error-correcting code, comprising:
a plurality of sub-decoders including a quantized belief propagation (QBP) sub-decoder, unquantized belief propagation (UBP) sub-decoder, and a mixed-integer linear programming (MILP) sub-decoder,
wherein the sub decoders connected sequentially such that a next sub-decoder has a slower processing time and a better word error rate than a previous sub-decoder, and
wherein the next sub-decoder is only executed if the previous decoder fails to decode the block sequence of symbols, and a last sub-decoder is executed until a termination condition is reached.

* * * * *